US008019560B2

(12) United States Patent
Nose et al.

(10) Patent No.: US 8,019,560 B2
(45) Date of Patent: Sep. 13, 2011

(54) SIGNAL MEASURING DEVICE

(75) Inventors: Koichi Nose, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 469 days.

(21) Appl. No.: 12/088,352

(22) PCT Filed: Sep. 28, 2006

(86) PCT No.: PCT/JP2006/319278
§ 371 (c)(1),
(2), (4) Date: Mar. 27, 2008

(87) PCT Pub. No.: WO2007/037314
PCT Pub. Date: Apr. 5, 2007

(65) Prior Publication Data
US 2009/0243624 A1 Oct. 1, 2009

(30) Foreign Application Priority Data

Sep. 28, 2005 (JP) .................................. 2005-282632

(51) Int. Cl.
*G01R 15/00* (2006.01)
(52) U.S. Cl. ........................................................ 702/57
(58) Field of Classification Search ................ 702/57, 702/64, 65, 69, 72, 111, 132, 183; 365/189.09; 327/157, 539; 341/155; 323/274
See application file for complete search history.

(56) References Cited

U.S. PATENT DOCUMENTS

| 6,965,337 B1* | 11/2005 | Bhattacharjee et al. ....... 341/155 |
| 6,989,660 B2* | 1/2006 | Mauthe ......................... 323/274 |
| 7,138,841 B1* | 11/2006 | Li et al. .......................... 327/175 |
| 7,224,210 B2* | 5/2007 | Garlapati et al. .............. 327/539 |
| 7,256,643 B2* | 8/2007 | Pan et al. ....................... 327/539 |
| 2003/0107924 A1* | 6/2003 | Mizuno et al. ............ 365/189.09 |
| 2004/0046595 A1* | 3/2004 | Ikehashi et al. ............... 327/157 |

FOREIGN PATENT DOCUMENTS

| JP | 61-029550 U | 2/1986 |
| JP | 07-012978 U | 3/1995 |
| JP | 07-32670 A | 12/1995 |
| JP | 2000-111587 A | 4/2000 |
| JP | 2005-098981 A | 4/2005 |

* cited by examiner

*Primary Examiner* — Mohamed Charioui
(74) *Attorney, Agent, or Firm* — Sughrue Mion, PLLC

(57) ABSTRACT

Small-scale measuring circuits ($111\text{-}1qum$) are arranged in m columns×q rows. The small-scale measuring circuits of each row ($111\text{-}11m$, $121\text{-}12m$, $1q1\text{-}1qm$) are connected in series. The respective rows are connected in parallel. Supplying reference signals B having different parameter values to the small-scale measuring circuits ($111\text{-}11m$, ...) connected in series makes it possible to improve the measurement range or measurement resolution. Supplying reference signals B having the same parameter to the respective rows can reduce a noise component depending on the transistor size. According to this invention, using a plurality of small-scale measuring circuits in accordance with required measurement performance concerning a measurement range, resolution, noise reduction, or the like can implement the desired performance while minimizing the area of each measuring circuit.

12 Claims, 15 Drawing Sheets

SIGNAL MEASURING DEVICE

TECHNICAL FIELD

The present invention relates to a signal measuring device provided in, for example, an integrated circuit.

BACKGROUND ART

Recently, increases in the speed and complexity of integrated circuits have worsened the problems of operation failure, a decrease in operating band, and the like due to noise in chips, variations in chip noise, clock timing fluctuations (jitter), and the like. Conventionally, signals are extracted outside an integrated circuit, and the behaviors of the signals are observed. Although the operating frequencies of integrated circuits have increased year by year, the operating frequencies of boards and packages outside the integrated circuits have not followed the increasing speeds. For this reason, it is impossible to neglect the influence of noise on a channel which is extracted outside the integrated circuit, and hence it is difficult to observe high-speed operation in the integrated circuit on the outside of the integrated circuit. This increases the need of a technique of observing internal operation by providing a measuring circuit in a chip.

A measuring circuit of this type is disclosed in Japanese Patent Laid-Open No. 2000-111587. As shown in FIG. 15, a conventional measuring circuit uses a method of using a signal value m×Td (m is an integer, and Td is a resolution) as a reference signal 1406, and comparing the reference signal 1406 with a to-be-measured signal 1407 to set, as an output signal 1401, m by which the magnitude relation between the signals is reversed. In this case, the minimum and maximum values of m are determined in accordance with the arrangements of a circuit which generates a signal value m×Td and a measuring circuit.

As shown in FIG. 16, when the value of a to-be-measured signal 1402 is m×Td+Δa, m is output as the output signal 1401. When the value of a to-be-measured signal 1403 is (m+1)×Td+Δb, m+1 is output. When the value of a to-be-measured signal 1404 is m×Td+Δc, m is output. As described above, since it is impossible to perform comparison in an interval equal to or less than Td, errors (quantization errors) corresponding to Td at maximum occur between the to-be-measured signals 1402 to 1404 and the output signals 1401 as measurement results.

DISCLOSURE OF INVENTION

Problem to be Solved by the Invention

The performance of a measuring circuit is improved by improving the measurement range (the minimum and maximum values of m) and the measurement resolution (Td). For this purpose, however, it is necessary to increase the area and power consumption of the circuit, resulting in an increase in manufacturing cost and a decrease in yield.

With regard to measurement of the above noise, variations in noise, or clock timing fluctuations (jitter), different measurement ranges and different measurement resolutions are required for the respective integrated circuits. In addition, in some cases, the range required for the measurement of measurement targets is difficult to predict, or greatly changes in size with time. The conventional measuring circuit needs to use a measurement macro with an excessively large measurement range or fine resolution, or needs to be re-designed for each integrated circuit. The former method increases the area or power consumption. The latter method takes the time required to design a measuring circuit for each integrated circuit.

On the other hand, the resolution is limited by an error in the measuring circuit due to transistor variations, thermal noise, or the like. As a countermeasure against this problem, a technique of increasing the number of measurements or increasing the transistor size is known. If, however, it is difficult to predict the range or resolution required for measurement of a measurement target at the stage of designing of an integrated circuit, or the size of the circuit greatly changes at the time of operation, over-design is required in consideration of all worst values. This may unnecessarily increase the area and power.

As described above, according to the prior art, the following problem occurs in the measurement of the above-mentioned noise and variations, and clock timing fluctuations (jitter). Since the required measurement range or resolution varies for each integrated circuit or each operation state, it is necessary to design a measuring circuit for each integrated circuit, or overhead occurs in area or power due to over-design.

It is a principal object of the present invention to provide a signal measuring device which implements required performance while minimizing the area of a measuring circuit. It is another object of the present invention to provide a signal measuring device which dynamically switches measurement ranges or resolutions after design.

Means of Solution to the Problem

A signal measuring device according to the present invention is characterized by comprising a plurality of measuring circuits, the measuring circuit comprising a reference signal generating unit which receives a reference signal and generates a plurality of reference signals having equally spaced parameter values with a parameter value of the reference signal being a base point, and a signal comparing unit which receives a to-be-measured signal, compares the to-be-measured signal with a plurality of reference signals output from the reference signal generating unit, and outputs comparison results.

Effects of the Invention

The signal measuring device according to the present invention can adjust performance concerning a measurement range, resolution, measurement accuracy, or the like, as needed, in accordance with the number of measuring circuits including reference signal generating units and signal comparing units. Therefore, the performance can be improved without any waste, and hence required performance can be implemented while the occupied area of each measuring circuit is minimized.

BEST MODE FOR CARRYING OUT THE INVENTION

The embodiments of the present invention will be described below with reference to the accompanying drawings.

First Embodiment

The first embodiment improves the performance of a signal measuring device by series- and parallel-connecting n measuring circuits.

Figure 1:
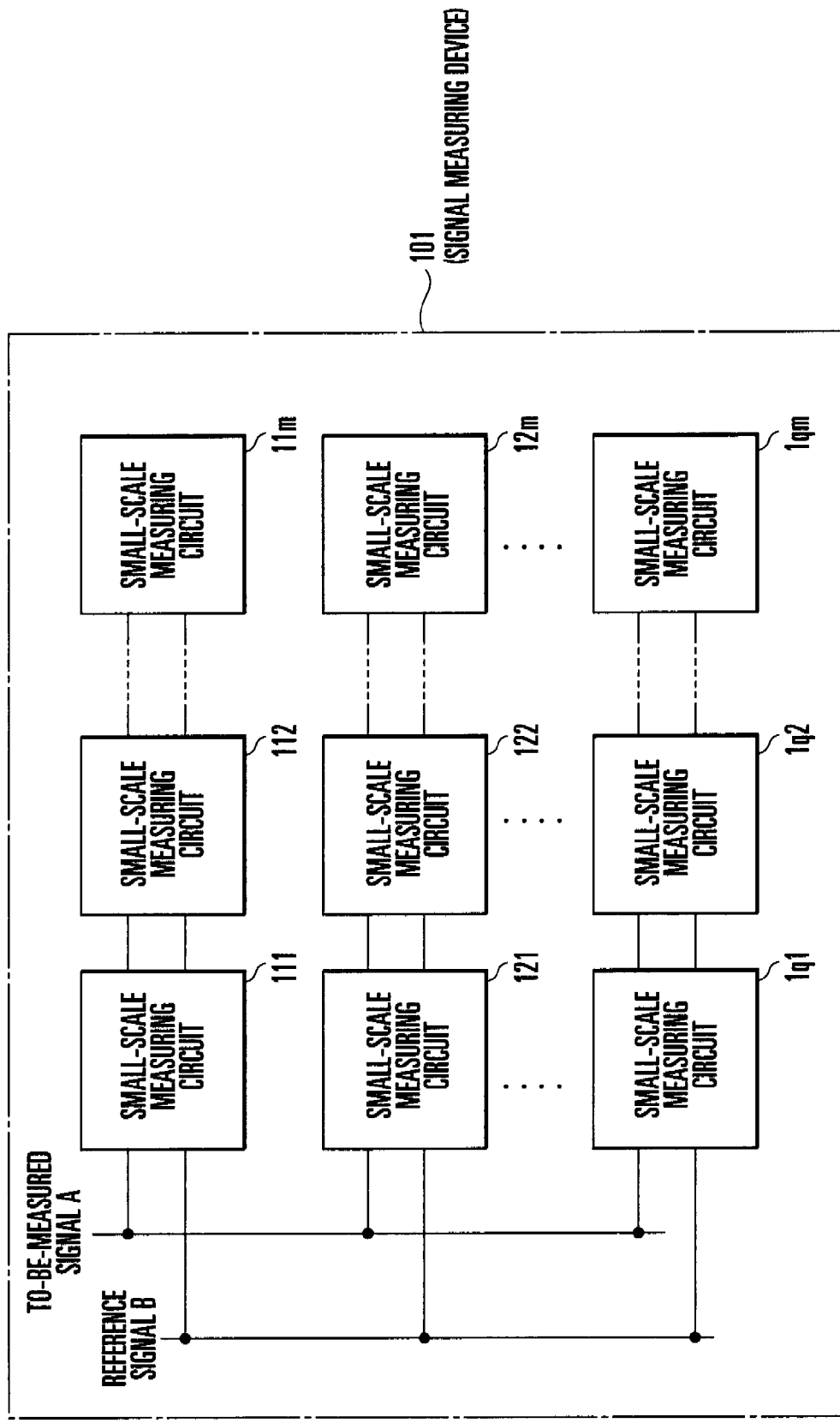
FIG. 1 is a block diagram showing a signal measuring device according to the first embodiment of the present invention.

FIG. 1 is a block diagram of the first embodiment of the signal measuring device according to the present invention. A signal measuring device 101 comprises n small-scale measuring circuits 111, 112, ..., 11$m$, 121, 122, ..., 12$m$, ..., 1$q$1, 1$q$2, ..., 1$qm$, where m and q are positive integers, and n is the product of m and q and also an integer equal to or more than 2.

The n small-scale measuring circuits 111 to 1$qm$ are arranged in m columns×q rows. The small-scale measuring circuits 111 to 11$m$, 121 to 12$m$, and 1$q$1 to 1$qm$ of the respective rows are connected in series, and the respective rows are connected in parallel. The small-scale measuring circuits 111 to 1$qm$ respectively receive to-be-measured signals A as measurement targets and reference signals B. Supplying the reference signals B with different parameter values to the series-connected small-scale measuring circuits 111 to 11$m$ (or 121 to 12$m$, ..., 1$q$1 to 1$qm$) can improve the measurement range or the measurement resolution. In addition, supplying the reference signals B with the same parameter to the respective rows can reduce noise components (variations, thermal noise, flicker noise, and the like) depending on the transistor size. Examples of the parameters of the reference signals B are a voltage and a phase. Concrete examples of circuits which implement series-connections and parallel-connections will be described below.

FIRST CONCRETE EXAMPLE

The first concrete example is configured to extend the measurement range by series-connecting a plurality of small-scale noise measuring circuits and directly supplying reference signals to the small-scale noise measuring circuits, respectively. Reference symbol S denotes a measurement range; B, a resolution, and Z, noise components (variations, thermal noise, flicker noise, and the like) depending on the transistor size.

Figure 2:
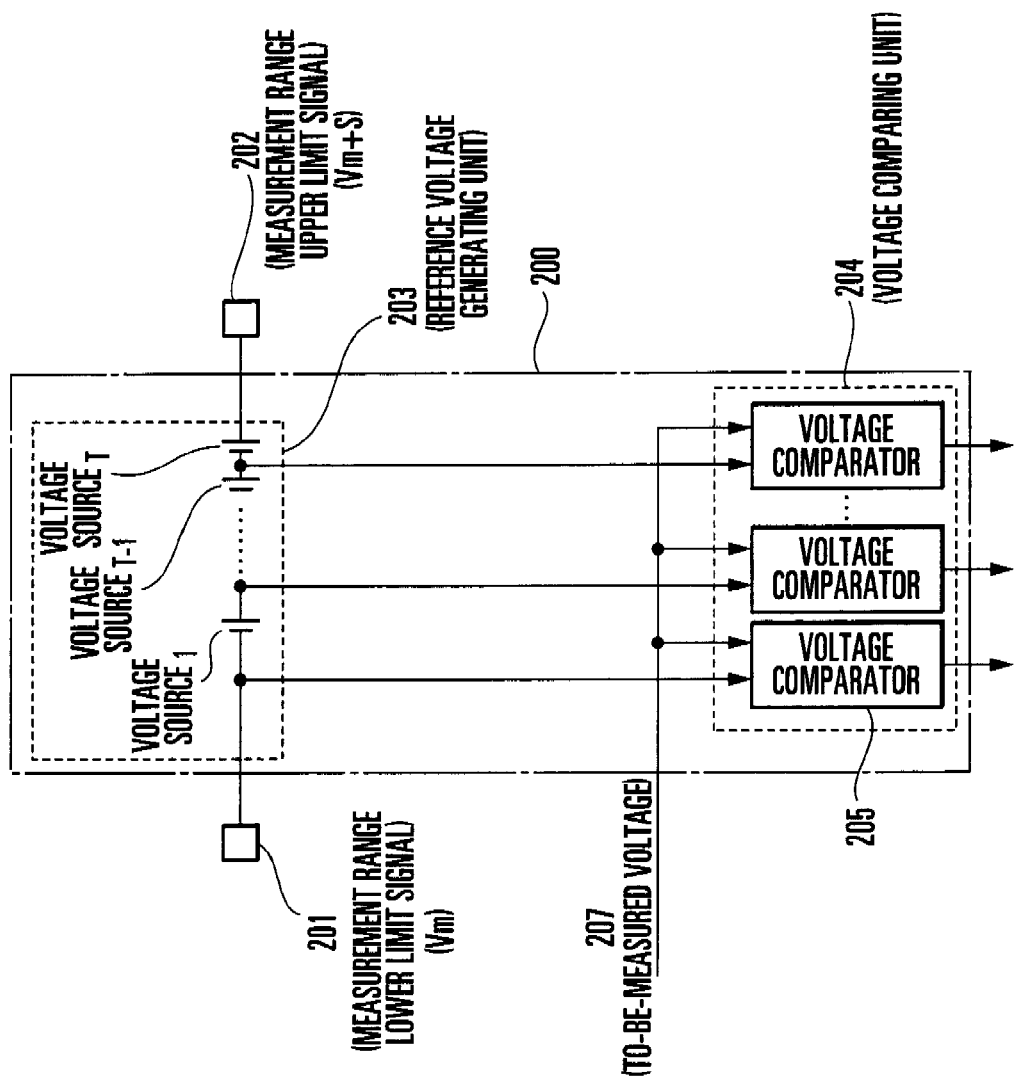
FIG. 2 is a circuit diagram showing a small-scale noise measuring circuit in the first concrete example of the first embodiment of the present invention.

For example, as shown in FIG. 2, a small-scale noise measuring circuit 200 comprises terminals 201 and 202, a reference voltage generating unit (reference signal generating unit) 203, and a voltage comparing unit (signal comparing unit) 204. The reference signal B is externally supplied to the terminal 201. The voltage of the reference signal B corresponds to the lower limit of the measurement range of the small-scale noise measuring circuit 200, and hence will be referred to as a measurement range lower limit voltage Vm. Letting S be the measurement range of the small-scale noise measuring circuit 200, the voltage at the terminal 202 is given by Vm+S. The voltage at the terminal 202 corresponds to the upper limit of the measurement range of the small-scale noise measuring circuit 200, and hence will be referred to as a measurement range upper limit voltage.

The reference voltage generating unit 203 is connected between the terminals 201 and 202, and generates a plurality of reference voltages having the parameter values of the reference signals B, i.e., equally spaced voltage values with the measurement range lower limit voltage being a base point. In this case, the reference voltage generating unit 203 comprises T (T is an integer) voltage sources whose output voltage is represented by S/T and which are connected in series. The voltages at the negative terminals of the respective voltage sources are extracted as reference voltages. Let Vm be the first reference voltage, Vm+S/T be the second reference voltage, ..., and Vm+S×(T−1)×/T be the Tth reference voltage. Letting k be an integer between 0 to T−1, the kth reference voltage is given by Vm+k×S/T. Note that the reference voltage generating unit 203 can be configured such that the voltages at the positive terminals of the respective voltage sources are extracted as reference voltages.

The voltage comparing unit 204 receives a to-be-measured signals 207, compares the to-be-measured signals 207 with the T reference voltages output from the reference voltage generating unit 203, and outputs the comparison results for the respective reference voltages. In this case, the voltage comparing unit 204 comprises T voltage comparators 205 provided for the respective reference voltages. Each voltage comparator 205 compares a corresponding reference voltage with the to-be-measured signal 207 and outputs the result. When the M voltage comparators 205 output results indicating that the to-be-measured signal 207 is higher in level than the reference voltages, the voltage comparing unit 204 can estimate that the voltage level of the to-be-measured signal 207 is $Vm+(M-1)\times S/T$.

A case in which the n small-scale noise measuring circuits 200 each shown in FIG. 2 are connected in series will be described with reference to FIG. 3. The reference voltage input to the jth-stage (j is an integer) small-scale noise measuring circuit is set to the value obtained by adding or subtracting, to or from the reference voltage input to the (j−1)th-stage small-scale noise measuring circuit corresponding to the preceding stage, the product of the interval and number of reference voltages generated by the reference signal generating unit of the (j−1)th small-scale noise measuring circuit.

More specifically, voltages whose values are shifted from each other by S are generated outside the small-scale noise measuring circuits using voltage sources 309 such that a reference voltage Vs is generated for a first small-scale noise measuring circuit 301, a reference voltage Vs+S is generated for a second small-scale noise measuring circuit 302, and a reference voltage $Vs+(n-1)\times S$ is generated for the nth small-scale noise measuring circuit. When these reference voltages are applied to the respective small-scale noise measuring circuits, the first small-scale noise measuring circuit 301 generates reference voltages Vs, Vs+S/T, ..., $Vs+S\times(T-1)/T$, the second small-scale noise measuring circuit 302 generates reference voltages Vs+S, (Vs+S)+S/T, ..., $(Vs+S)+S\times(T-1)/T$, and the nth small-scale noise measuring circuit generates reference voltages $Vs+(n-1)\times S$, $(Vs+(n-1)\times S)+S/T$, ..., $(Vs+(n-1)\times S)+S\times(T-1)/T$. The measurement range of the first small-scale noise measuring circuit 301 is from Vs to $Vs+S\times(T-1)/T$, the measurement range of the second small-scale noise measuring circuit 302 is from Vs+S to $(Vs+S)+S\times(T-1)/T$, and the measurement range of the nth small-scale noise measuring circuit is from $Vs+(n-1)\times S$ to $(Vs+(n-1)\times S)+S\times(T-1)/T$. Therefore, the noise measurement range of the overall signal measuring device extends to the range from Vs to $(Vs+(n-1)\times S)+S\times(T-1)/T$.

Figure 3:
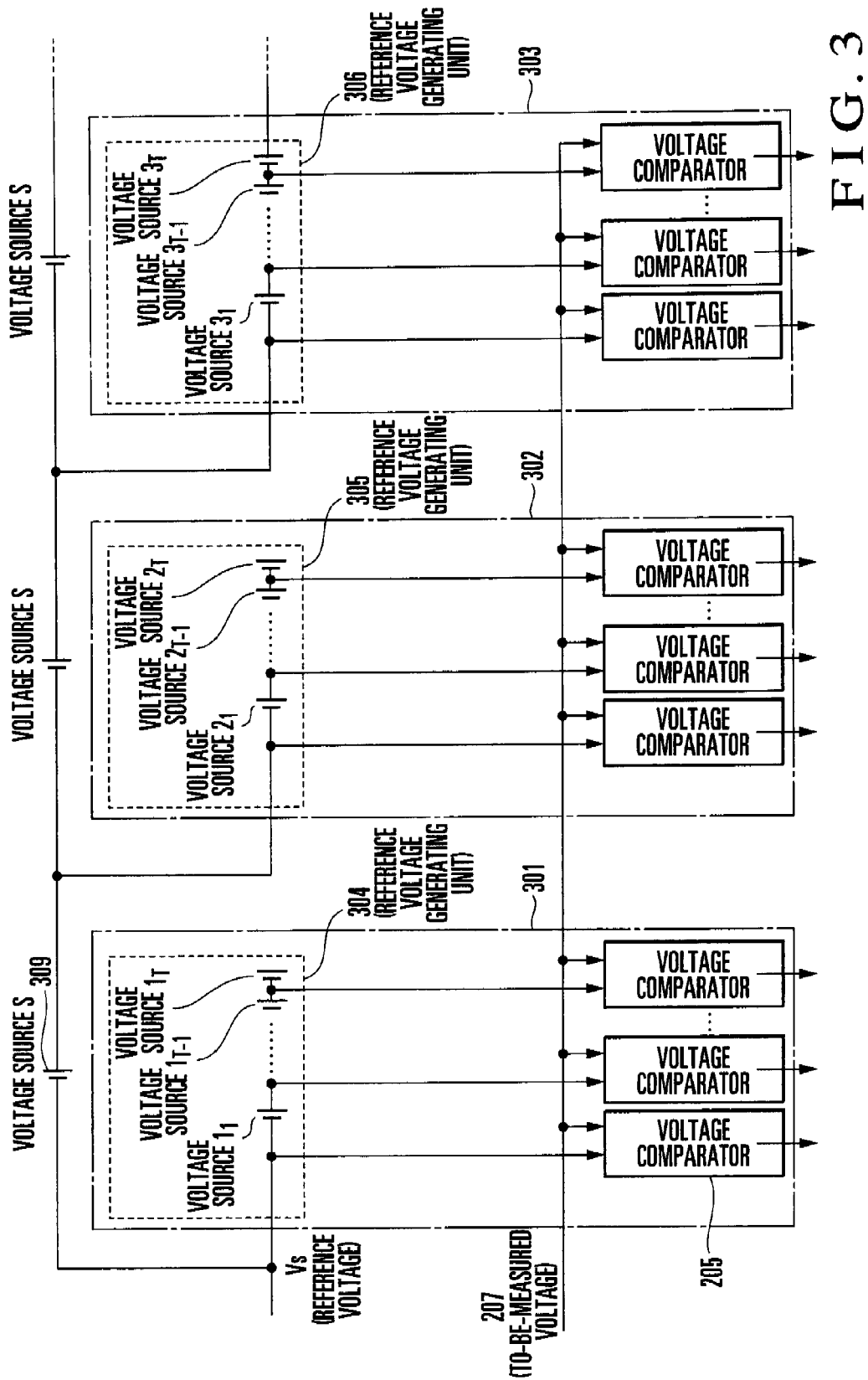
FIG. 3 is a circuit diagram showing an example of the series connection of small-scale noise measuring circuits in the first concrete example of the first embodiment of the present invention.

Referring to FIG. 3, a reference voltage generating unit 304 of the small-scale noise measuring circuit 301 comprises T voltage sources $1_1, \ldots, 1_{T-1}$, and $1_T$. A reference voltage generating unit 305 of the small-scale noise measuring circuit 302 comprises T voltage sources $2_1, \ldots, 2_{T-1}$, and $2_T$, and a reference voltage generating unit 306 of a small-scale noise measuring circuit 303 comprises T voltage sources $3_1, \ldots, 3_{T-1}$, and $3_T$.

SECOND CONCRETE EXAMPLE

Figure 4:
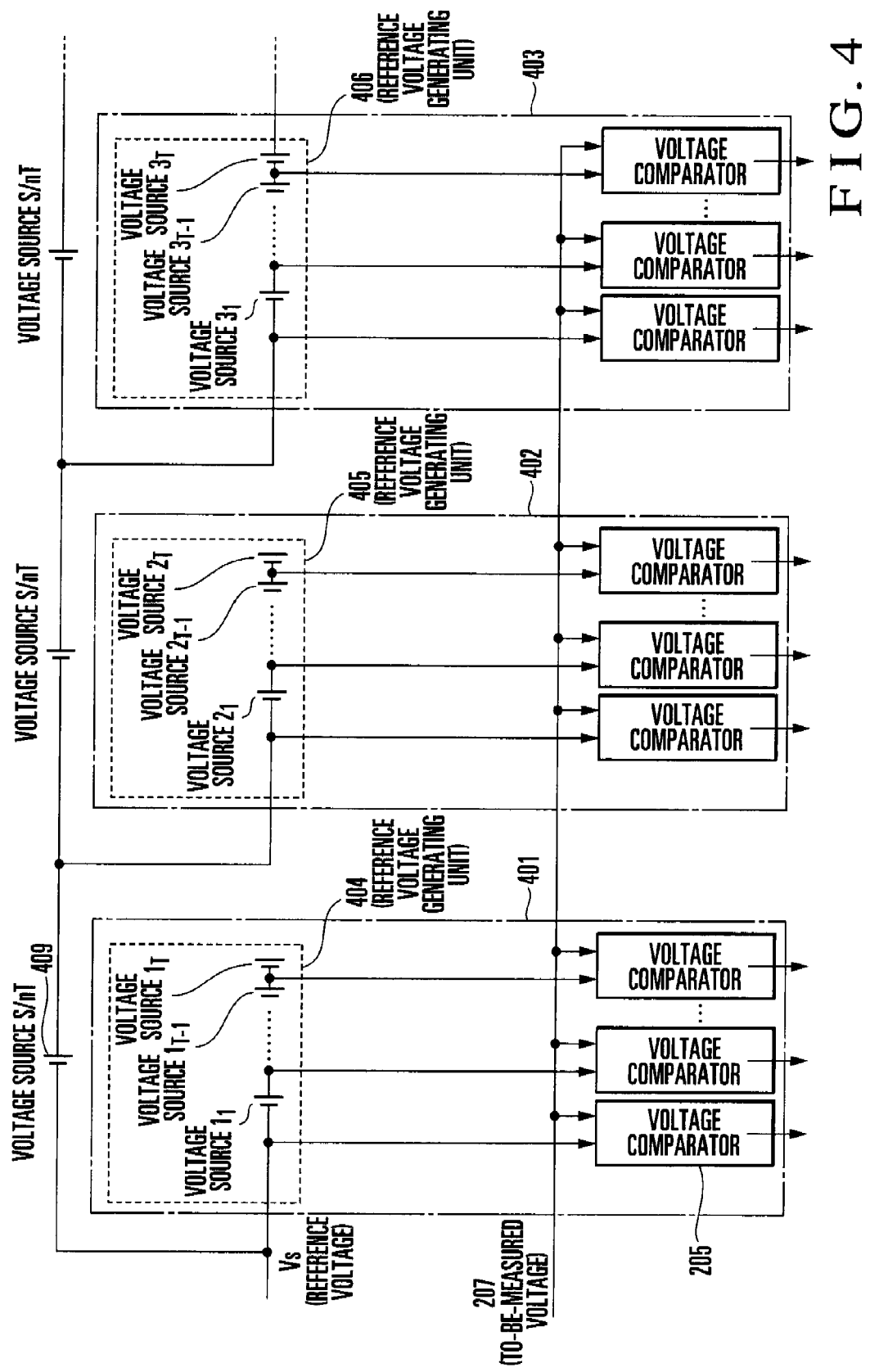
FIG. 4 is a circuit diagram showing an example of the series connection of small-scale noise measuring circuits in the second concrete example of the first embodiment of the present invention.

The second concrete example is configured to improve the resolution by series-connecting a plurality of small-scale noise measuring circuits and applying external voltages as reference signals to the respective small-scale noise measuring circuits. FIG. 4 shows a case in which n small-scale noise measuring circuits 200 each shown in FIG. 2 are connected in series.

In order to improve the resolution of the signal measuring device, the n small-scale noise measuring circuits 200 are prepared, and the reference voltage input to the jth-stage small-scale noise measuring circuit is set to the value obtained by adding or subtracting, to or from the reference voltage input to the (j−1)th-stage small-scale noise measuring circuit corresponding to the preceding stage, the quotient obtained by dividing the interval of the reference voltages generated by the reference signal generating unit of the (j−1)th small-scale noise measuring circuit by n. More specifically, the reference voltages for the first, second, and nth small-scale noise measuring circuits are respectively set to Vs, Vs+(S/T)/n, and $Vs+(SIT)\times(n-1)/n$. Voltage sources 409 with a voltage S/nT are used to set reference voltages in this manner.

Figure 5:
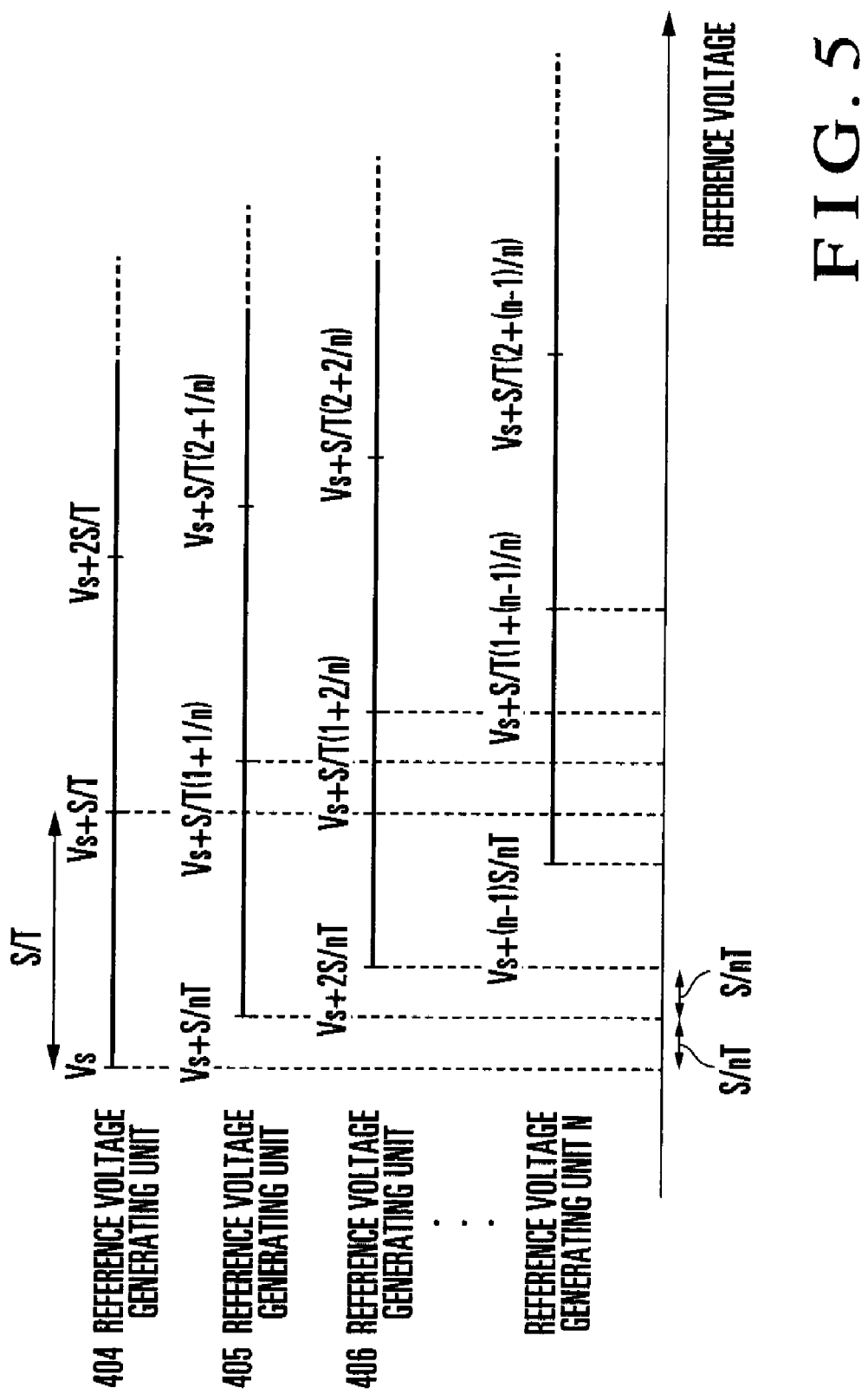
FIG. 5 is a graph showing reference voltages which can be generated by the series connection of the small-scale noise measuring circuits in the second concrete example of the first embodiment of the present invention.

FIG. 5 shows an arrangement of the reference voltages generated by reference voltage generating units 404, 405, 406, ... of n small-scale noise measuring circuits 401, 402, 403, .... As is obvious from FIG. 5, a reference voltage is output from one of the n reference voltage generating units 401, 402, 403, ... at intervals $S/(T\times n)$. That is, the reference voltage resolution of the overall signal measuring device is reduced to $S/(T\times n)$.

THIRD CONCRETE EXAMPLE

Figure 6:
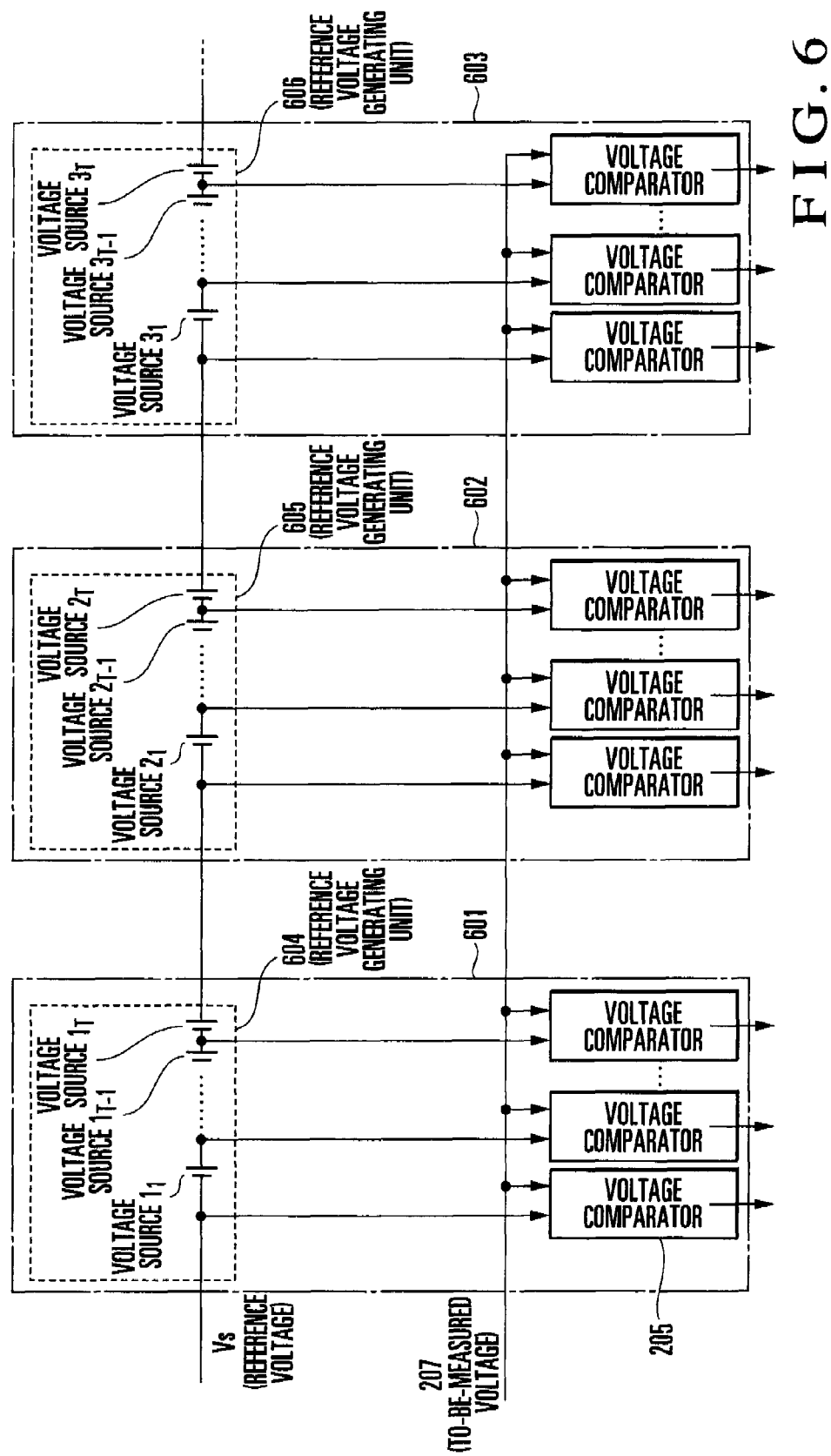
FIG. 6 is a circuit diagram showing an example of the series connection of the small-scale noise measuring circuits in the third concrete example of the first embodiment of the present invention.

The third concrete example is configured to extend the measurement range by series-connecting a plurality of small-scale noise measuring circuits and inputting a measurement range upper limit signal from the small-scale noise measuring circuit on the preceding stage as a measurement range lower limit signal for the succeeding stage. FIG. 6 shows a case in which the n small-scale noise measuring circuits 200 each shown in FIG. 2 are connected in series.

Letting Vs be the reference voltage, i.e., the measurement range lower limit voltage, of a first small-scale noise measuring circuit 601, the measurement range upper limit voltage of the first small-scale noise measuring circuit 601 is represented by Vs+S. The measurement range upper limit voltage Vs+S is connected to the measurement range lower limit voltage terminal of a second small-scale noise measuring circuit 602, and a measurement range upper limit voltage Vs+2×S of the second small-scale noise measuring circuit is connected to the measurement range lower limit voltage terminal of a third small-scale noise measuring circuit 603. This operation is repeated to set the measurement range of the first small-scale noise measuring circuit 601 to the range from Vs to $Vs+S\times(T-1)/T$, set the measurement range of the second small-scale noise measuring circuit 602 to the range from Vs+S to $(Vs+S)+S\times(T-1)/T$, and set the measurement range of the nth small-scale noise measuring circuit to the range from $Vs+(n-1)\times S$ to $(Vs+(n-1)\times S)+S\times(T-1)/T$. As a result, the noise measurement range of the overall signal measuring device extends to the range from Vs to $(Vs+(n-1)\times S)+S\times(T-1)/T$, as in the first concrete example.

A characteristic feature of the third concrete example is that there is no need to generate reference voltages outside the small-scale noise measuring circuits unlike in the first and second concrete examples. Referring to FIG. 6, reference voltage generating units 604, 605, and 606 of the small-scale noise measuring circuits 601, 602, and 603 have the same arrangement as that of the reference voltage generating unit 304, 305, and 306 in the first concrete example. In addition, the reference voltages generated by the reference voltage generating units 604, 605, and 606 are the same as those generated by the reference voltage generating units 304, 305, and 306.

FOURTH CONCRETE EXAMPLE

Figure 7:
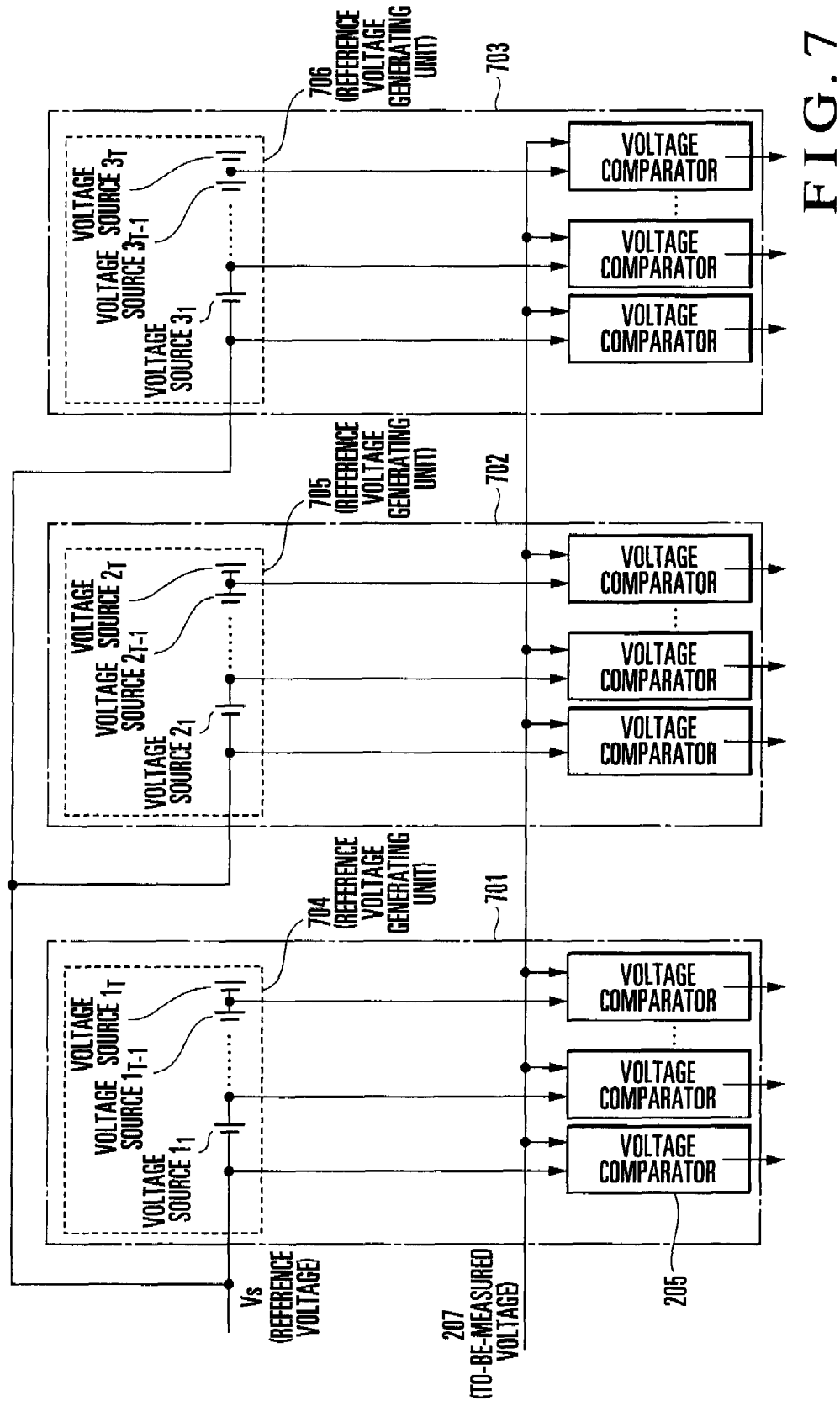
FIG. 7 is a circuit diagram showing an example of the parallel connection of the small-scale noise measuring circuits in the fourth concrete example of the first embodiment of the present invention.

In the fourth concrete example, a plurality of small-scale noise measuring circuits are connected in parallel. FIG. 7 shows a case in which n small-scale noise measuring circuits 200 each shown in FIG. 2 are connected in parallel.

Identical reference voltages Vs are input to all n small-scale noise measuring circuits 701, 702, 703, . . . , and reference voltage generating units 704, 705, 706, . . . of the respective small-scale noise measuring circuits generate reference voltages having the same level. More specifically, all the reference voltage generating units 704, 705, 706, . . . generate reference voltages Vs, Vs+S/T, . . . , Vs+S×(T−1)/T. In this case, although the measurement range and the resolution remain unchanged, a noise component due to the transistor size, e.g., thermal noise in each of the small-scale noise measuring circuits 701, 702, 703, . . . , process variations, or the offsets of voltage comparators 205 can be reduced to 1/√n by taking the average of n measurement results obtained by measuring the same signal using the n small-scale noise measuring circuits 701, 702, 703, . . . .

FIFTH CONCRETE EXAMPLE

Figure 8:
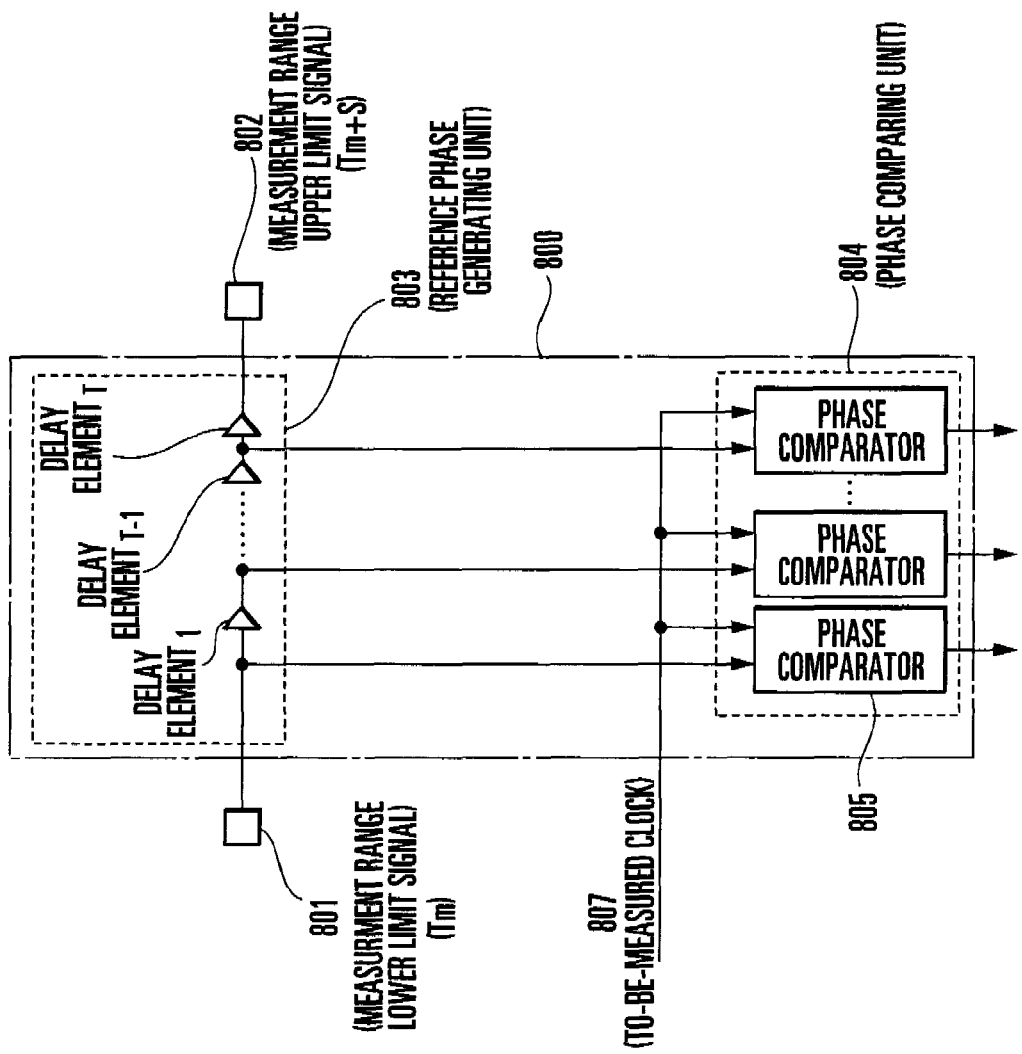
FIG. 8 is a circuit diagram showing a small-scale clock jitter measuring circuit in the fifth concrete example of the first embodiment of the present invention.

In the fifth concrete example, small-scale clock jitter measuring circuits are connected in series. For example, as shown in FIG. 8, a small-scale clock jitter measuring circuit 800 comprises a measurement range lower limit signal terminal 801, a measurement range upper limit signal terminal 802, a reference phase generating unit (reference signal generating unit) 803, and a phase comparing unit (signal comparing unit) 804. A reference clock A, i.e., a measurement range lower limit phase Tm, is input to the measurement range lower limit signal terminal 801.

The reference phase generating unit 803 is connected between the terminals 801 and 802, and generates a plurality of reference phases having equally spaced phases with the parameter value of the reference clock A, i.e., the measurement range lower limit phase Tm, being a base point. In this case, the reference phase generating unit 803 has an arrangement in which T delay elements with a delay time of S/T are connected in series, and the phase on the input side of each delay element is extracted as a reference phase. Therefore, the first reference phase is represented by Tm, the second reference phase is represented by Tm+S/T, . . . , and the Tth reference phase is represented by Tm+S×(T−1)×/T. Letting k be an integer from 0 to T−1, the kth reference phase is represented by Tm+k×S/T. Note that the reference phase generating unit 803 may be configured to extract the phase on the output side of each delay element as a reference phase.

The phase comparing unit 804 receives a to-be-measured clock 807, compares the to-be-measured clock 807 with T reference phases output from the reference phase generating unit 803, and outputs the comparison results for the respective reference phases. In this case, the phase comparing unit 804 comprises T phase comparators 805 provided for the respective reference phases. Each phase comparator 805 compares a corresponding reference phase with the to-be-measured clock 807, and outputs the result. When the M phase comparators 805 output results indicating that the to-be-measured clock 807 is higher in level than the reference phases, the phase comparing unit 804 can estimate that the time shift (jitter) of the to-be-measured clock 807 with respect to the reference clock A is (M−1)×S/T.

As a technique of extending the measurement range or resolution of the small-scale clock jitter measuring circuit 800, an arrangement similar to those of the first to third concrete examples can be used.

Figure 9:
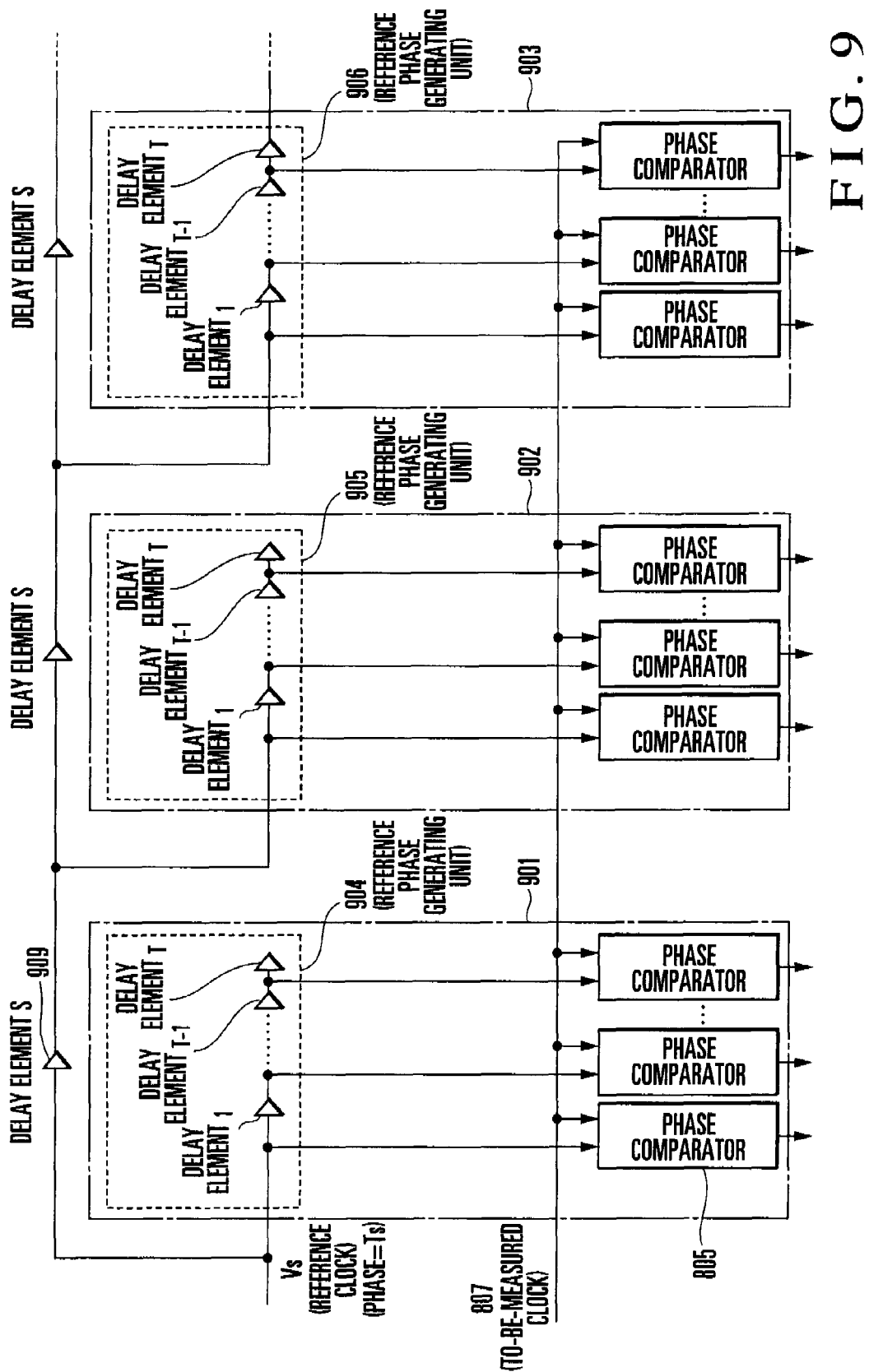
FIG. 9 is a circuit diagram showing the first arrangement of the series connection of small-scale clock jitter measuring circuits in the fifth concrete example of the first embodiment of the present invention.

As shown in FIG. 9, the first arrangement can be implemented by using n small-scale clock jitter measuring circuits 800 each shown in FIG. 8, and n−1 delay elements 909 each having a delay amount S. Letting Ts be the measurement range lower limit phase of a first small-scale clock jitter measuring circuit 901, the measurement range lower limit phase of a second small-scale clock jitter measuring circuit 902 is represented by Ts+S because of the intermediacy of the delay elements 909. In addition, the measurement range lower limit phases of the kth small-scale clock jitter measuring circuit are set to Ts+(k−1)×S and to values shifted from Ts+(k−1)×S by S, thereby extending the jitter measurement range of the overall signal measuring device to the range from Ts to (Ts+(n−1)×S)+S×(T−1)/T.

Figure 10:
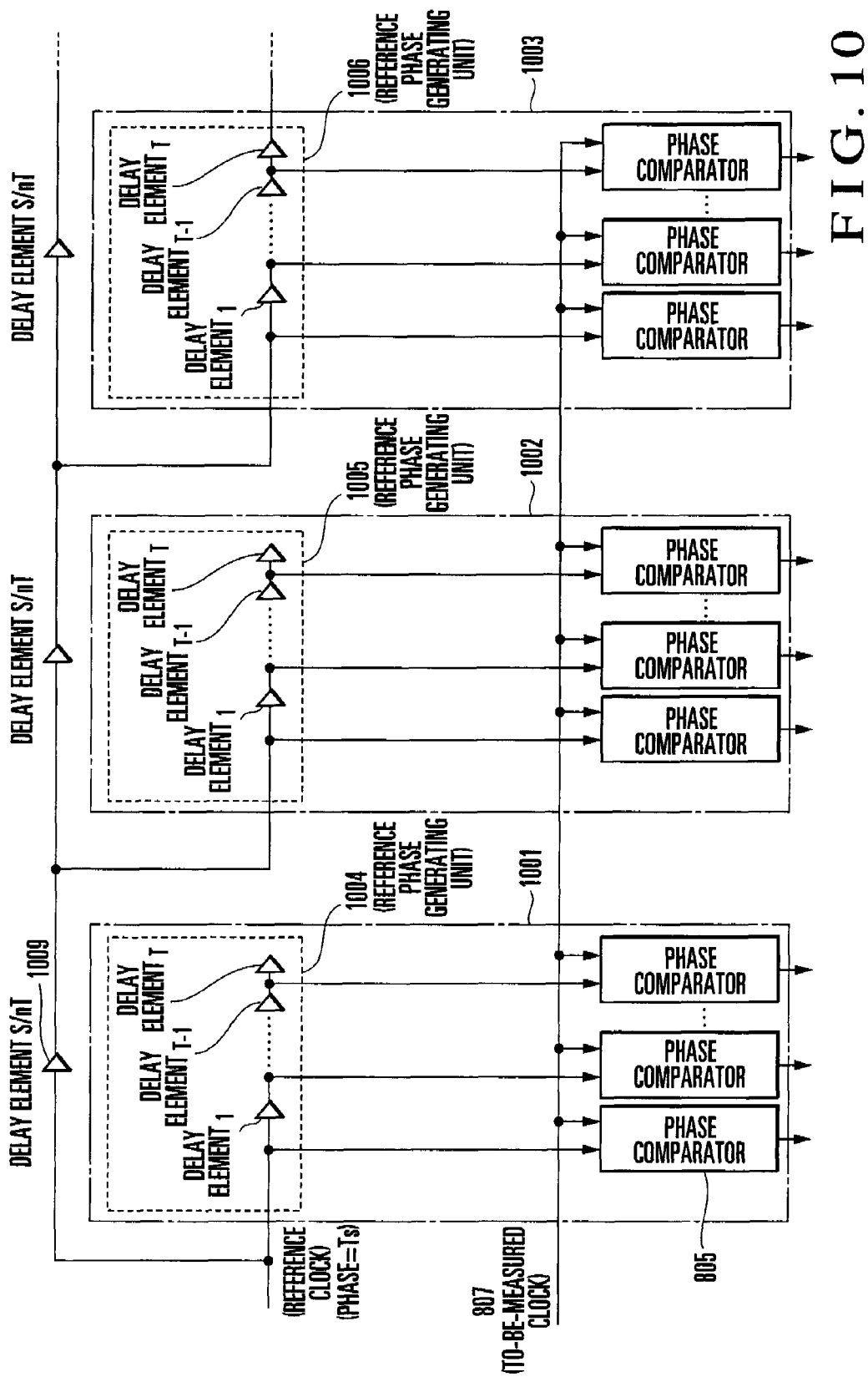
FIG. 10 is a circuit diagram showing the second arrangement of the series connection of the small-scale clock jitter measuring circuits in the fifth concrete example of the first embodiment of the present invention.

As shown in FIG. 10, in the second arrangement, the n small-scale clock jitter measuring circuits 800 each shown in FIG. 8 are prepared, and n−1 delay elements 1009 each having a delay amount S/nT are used to set the measurement range lower limit phase of a first small-scale clock jitter measuring circuit 1001 to Ts, the measurement range lower limit phase of a second small-scale clock jitter measuring circuit 1002 to Ts+(S/T)/n, and the measurement range lower limit phase of the nth small-scale clock jitter measuring circuit to Ts+(S/T)×(n−1)/n. With this operation, n reference phase generating units 1004, 1005, 1006, . . . each output a reference phase at intervals S/(T×n). Therefore, the phase resolution of the overall signal measuring device is improved to S/(T×n). Conventionally, the delay time of each delay element is finite, and hence it is difficult to improve the resolution by decreasing the delay time S of each delay element. A characteristic feature of this method is that even if the resolution of each of the n small-scale clock jitter measuring circuits 1001, 1002, 1003, . . . , i.e., the delay time of each of delay elements constituting the reference phase generating units 1004, 1005, 1006, . . . , remains S, the resolution of the overall signal measuring device can be improved to S/n.

Figure 11:
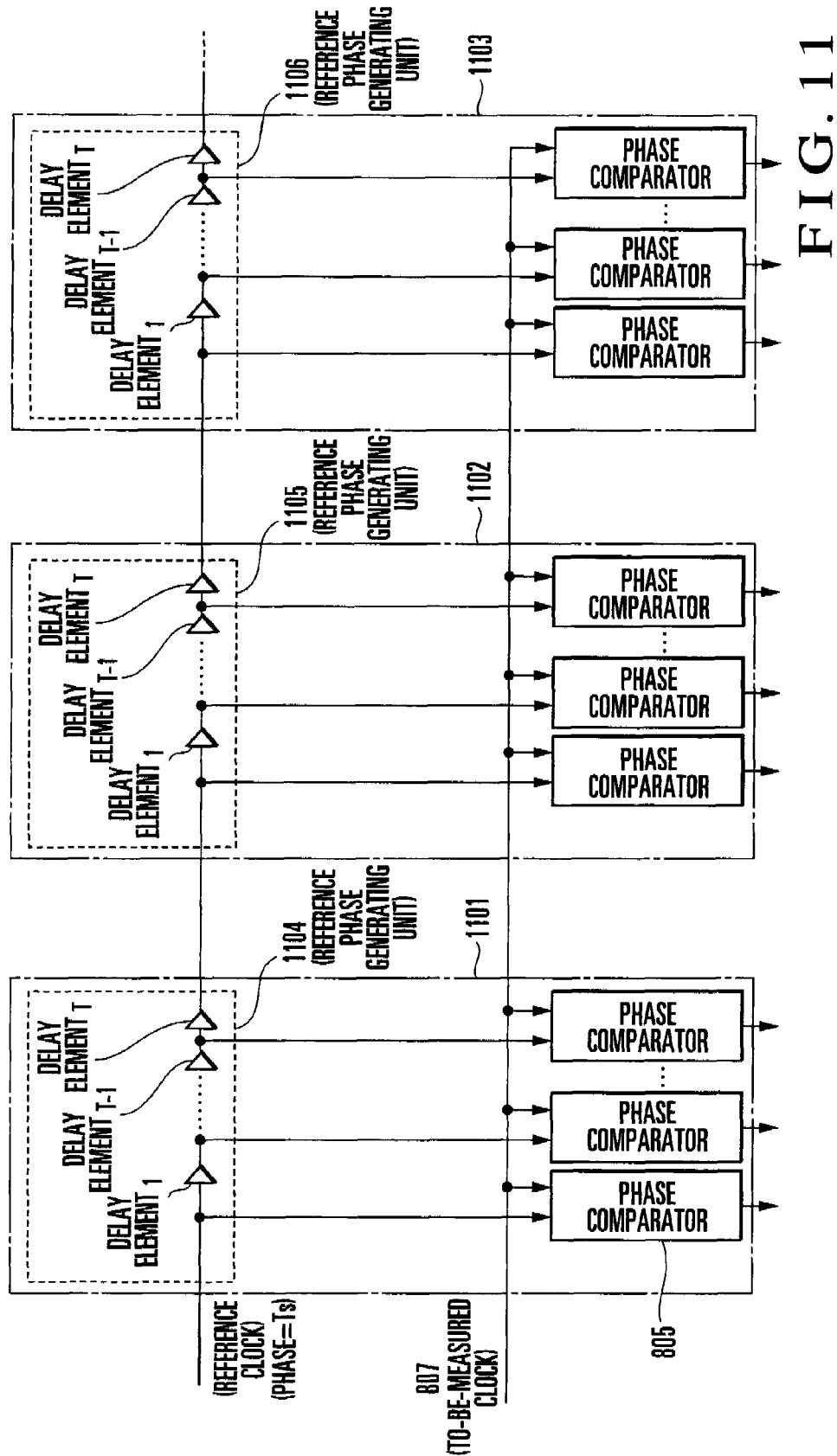
FIG. 11 is a circuit diagram showing the third arrangement of the series connection of the small-scale clock jitter measuring circuits in the fifth concrete example of the first embodiment of the present invention.

As shown in FIG. 11, in the third arrangement, n small-scale clock jitter measuring circuits 800 each shown in FIG. 8 are prepared. Letting Ts be the measurement range lower limit phase of a first small-scale clock jitter measuring circuit 1101, the measurement range upper limit phase of the first small-scale clock jitter measuring circuit 1101 is represented by Ts+S. Therefore, this measurement range upper limit phase is connected to the measurement range lower limit phase terminal of a second small-scale clock jitter measuring circuit 1102, and a measurement range upper limit phase Ts+2×S of the second small-scale clock jitter measuring circuit 1102 is connected to the measurement range lower limit phase terminal of a third small-scale clock jitter measuring circuit 1103. This operation is repeated to set the measurement range of the first small-scale clock jitter measuring circuit 1101 to the range from Ts to Ts+S×(T−1)/T, set the measurement range of second small-scale clock jitter measuring circuit 1102 to the range from Ts+S to (Ts+S)+S×(T−1)/T, and set the measurement range of the nth small-scale clock jitter measuring circuit to the range from Ts+(n−1)×S to (Ts+(n−1)×S)+S×(T−1)/T. As a result, the clock jitter measurement range of the overall signal measuring device extends to the range from Ts to (Ts+(n−1)×S)+S×(T−1)/T. An advantage of the third arrangement is that there is no need to generate measurement range lower limit phases (reference clocks) outside the small-scale clock jitter measuring circuits unlike in the first and second arrangements.

SIXTH CONCRETE EXAMPLE

Figure 12:
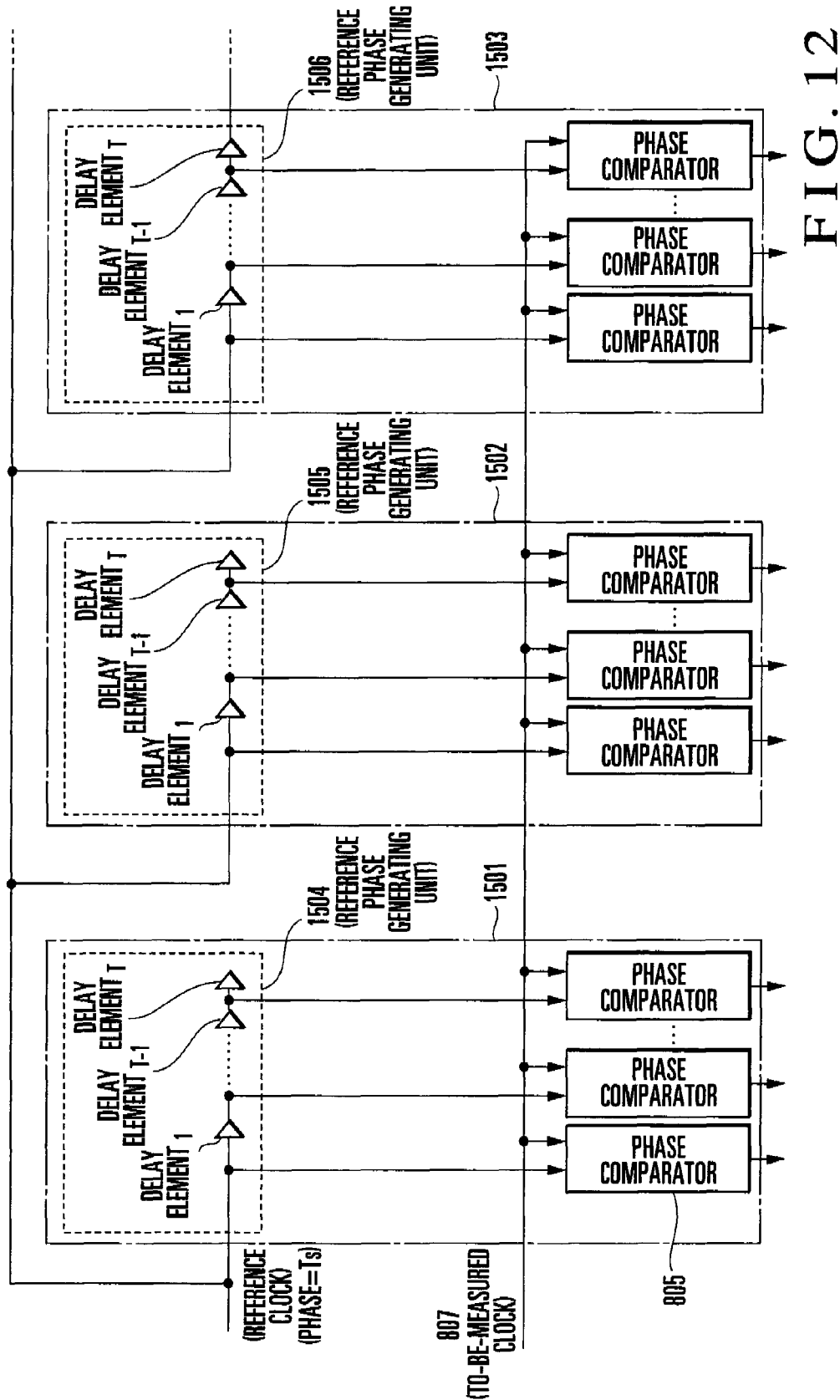
FIG. 12 is a circuit diagram showing the parallel connection of small-scale clock jitter measuring circuits in the sixth concrete example of the first embodiment of the present invention.

In the sixth concrete example, small-scale clock jitter measuring circuits are connected in parallel. FIG. 12 shows a case in which the n small-scale clock jitter measuring circuits 800 each shown in FIG. 6 are arranged in parallel.

All the phases of input signals to n small-scale clock jitter measuring circuits 1501, 1502, 1503, . . . are set to Ts, and reference phase generating units 1504, 1505, 1506, . . . of the respective small-scale clock jitter measuring circuits generate reference phases having the same level. In this case, although the measurement range and the resolution remain unchanged, a noise component due to the transistor size, e.g., thermal noise in each of the small-scale clock jitter measuring circuits 1501, 1502, 1503, . . . , process variations, or the offsets of voltage comparators can be reduced to $1/\sqrt{n}$ by taking the average of n measurement results obtained by measuring the same signal using the n small-scale clock jitter measuring circuits 1501, 1502, 1503, . . . .

Second Embodiment

The second embodiment relates to performance switching for measuring circuits by an input switching circuit.

Performances can be statically or dynamically switched by adding input switching circuits to the n small-scale measuring circuits in the first embodiment and properly controlling inputs.

SEVENTH CONCRETE EXAMPLE

Figure 13:
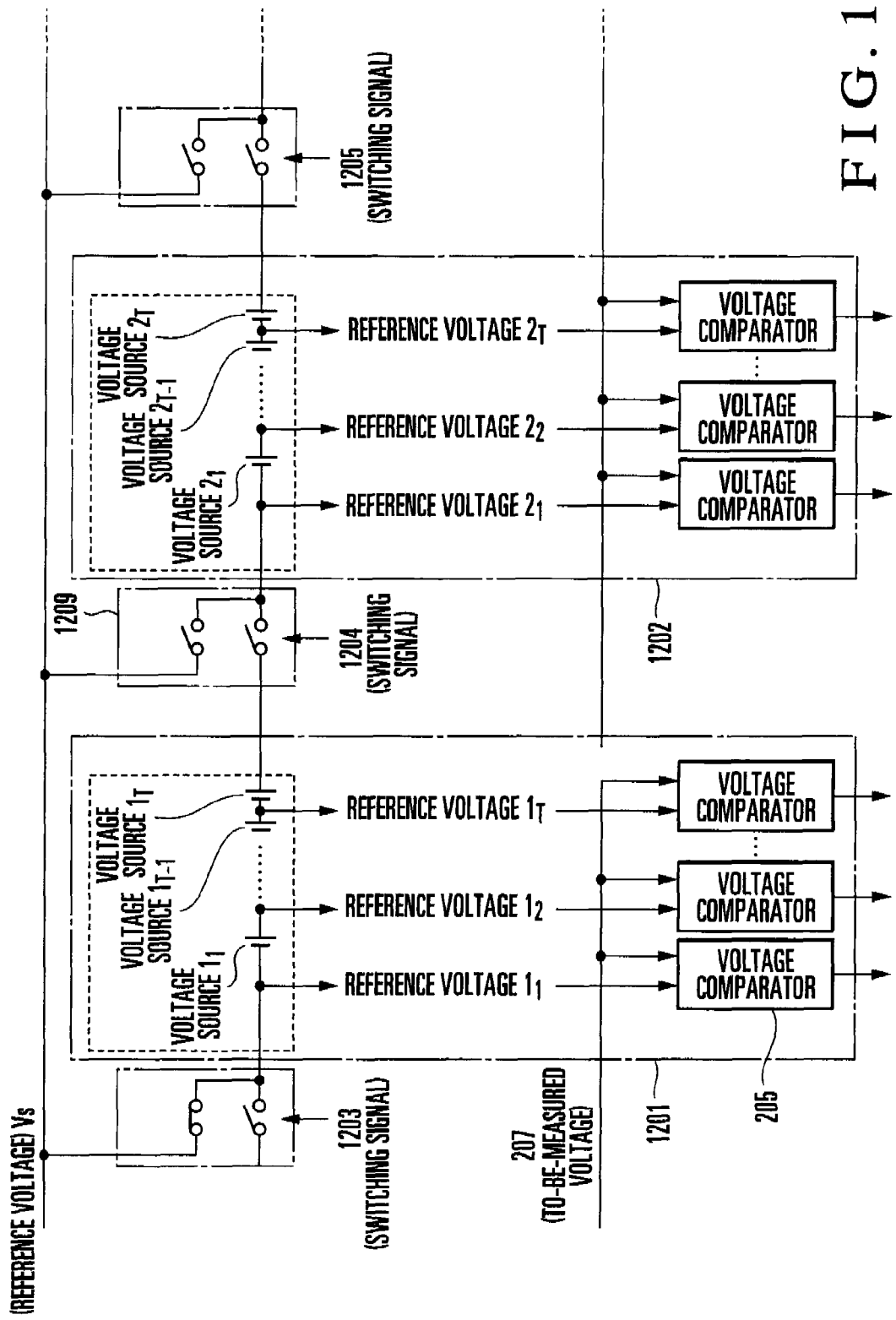
FIG. 13 is a circuit diagram showing a function switching function for each small-scale noise measuring circuit in the seventh concrete example of the second embodiment of the present invention.

The seventh concrete example relates to dynamic switching for small-scale noise measuring circuits. FIG. 13 shows the seventh concrete example. As shown in FIG. 13, reference voltage switching circuits 1209 are respectively provided for small-scale noise measuring circuits 1201, 1202, . . . . Each reference voltage switching circuit selects one of a plurality of reference voltages having different voltage values to a corresponding one of the small-scale noise measuring circuits 1201, 1202, . . . . Reference voltages are selected in accordance with switching signals 1203, 1204, 1205, . . . . Letting the reference voltage switching circuits 1209 have selector structures designed to switch connection using switches makes it possible to arbitrarily switch the above operations even after design.

As in the third concrete example of the first embodiment, the noise measurement range can be extended by setting the operation ranges of the reference voltage generating units of a plurality of small-scale noise measuring circuits to values shifted from each other by S. That is, the operation range can be extended by controlling the reference voltage switching circuits 1209 so as to connect the measurement range upper limit voltage of the ith small-scale noise measuring circuit 1201 to the measurement range lower limit voltage of the (i+1)th small-scale noise measuring circuit 1202. On the other hand, a noise component due to the transistor size, e.g., thermal noise in each of the small-scale noise measuring circuits 1201, 1202, . . . , process variations, or the offsets of voltage comparators 205 can be reduced to $1/\sqrt{n}$ by controlling the reference voltage switching circuits 1209 so as to apply the same measurement range lower limit voltage to the small-scale noise measuring circuits 1201, 1202, . . . .

EIGHTH CONCRETE EXAMPLE

Figure 14:
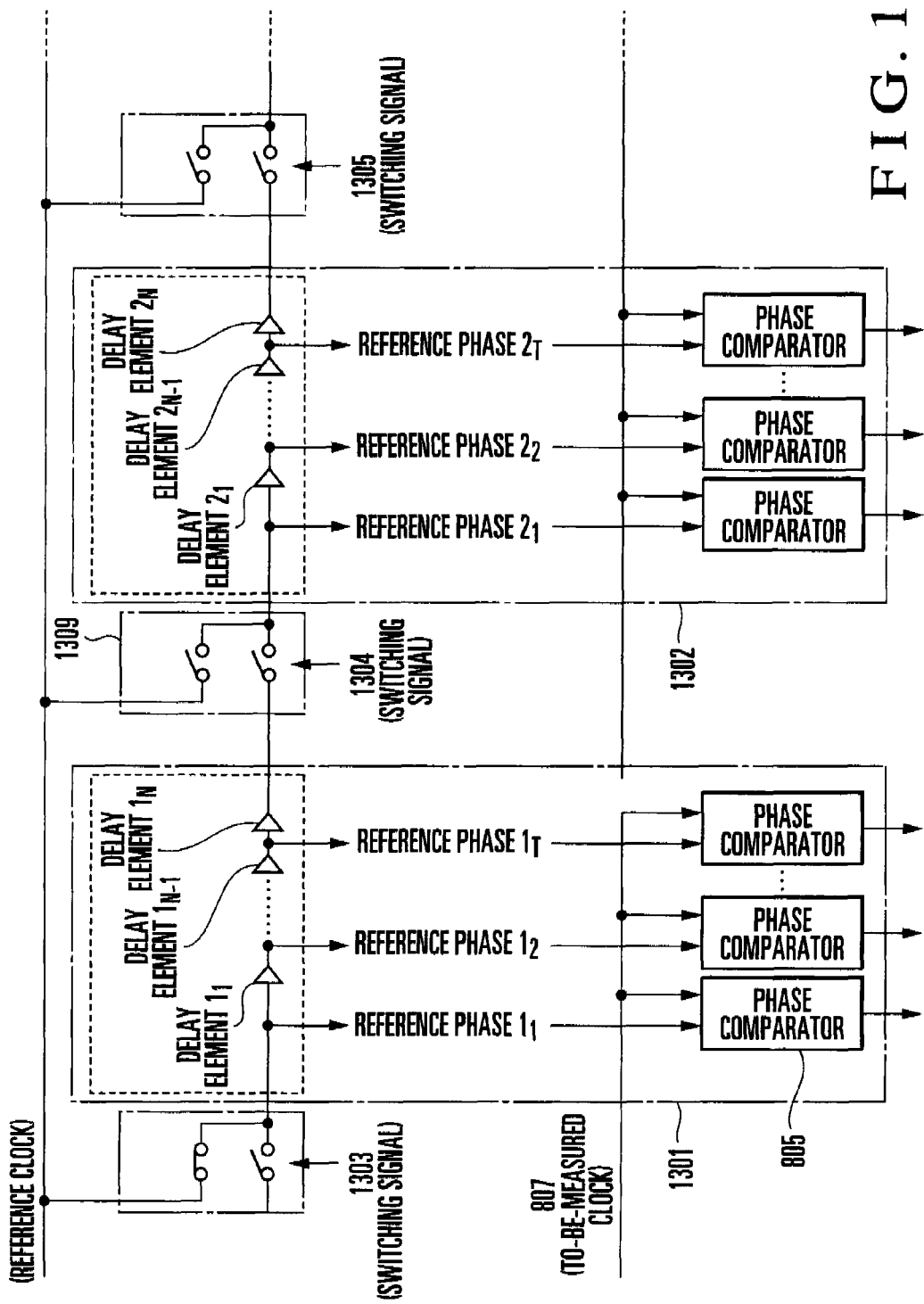
FIG. 14 is a circuit diagram showing a function switching function for each small-scale clock jitter measuring circuit in the eighth concrete example of the second embodiment of the present invention.
Figure 15:
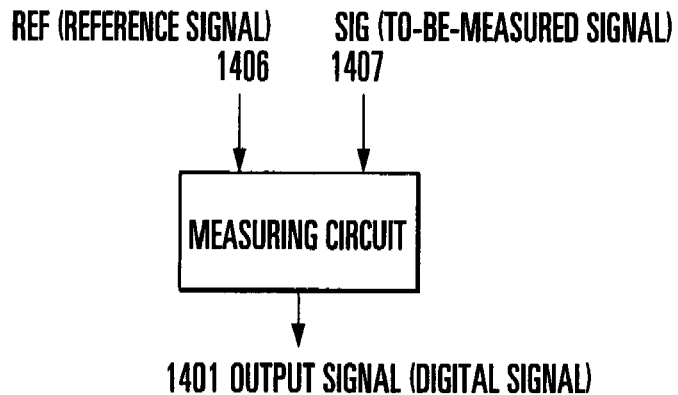
FIG. 15 is a block diagram showing the arrangement of a conventional measuring circuit.
Figure 16:
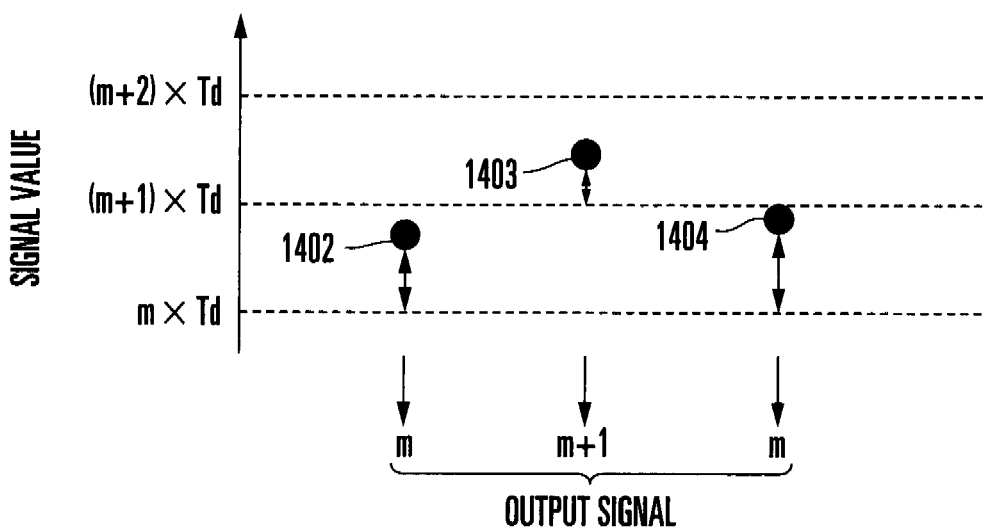
FIG. 16 is a view for explaining quantization errors which occur when the conventional measuring circuit is used.

The eighth concrete example relates to dynamic switching for small-scale clock jitter measuring circuits. FIG. 14 shows the eighth concrete example. As shown in FIG. 14, reference phase switching circuits 1309 are respectively provided for small-scale clock jitter measuring circuits 1301, 1302, . . . . Each reference phase switching circuit selects one of a plurality of reference clocks having different phases to a corresponding one of the small-scale clock jitter measuring circuits 1301, 1302, . . . . Reference clocks are selected in accordance with switching signals 1303, 1304, 1305, . . . . Letting the reference phase switching circuits 1309 have structures designed to switch connection using switches makes it possible to arbitrarily switch the above operations even after design.

As in the fifth concrete example of the first embodiment, the clock jitter measurement range can be extended by setting the operation ranges of the reference phase generating units of a plurality of small-scale clock jitter measuring circuits 1301, 1302, . . . to values shifted from each other by S. That is, the operation range can be extended by controlling the reference phase switching circuits 1309 so as to connect the measurement range upper limit phase of the ith small-scale clock jitter measuring circuit 1301 to the measurement range lower limit phase of the (i+1)th small-scale clock jitter measuring circuit 1302. On the other hand, a noise component due to the transistor size, e.g., thermal noise in each of the small-scale clock jitter measuring circuits 1301, 1302, . . . , process variations, or the offsets of voltage comparators 805, can be reduced to $1/\sqrt{n}$ by controlling the reference phase switching circuits 1309 so as to apply the same measurement range lower limit phase to all the small-scale clock jitter measuring circuits 1301, 1302, . . . .

As has been described above, the signal measuring device according to the present invention comprises a plurality of measuring circuits. These measuring circuits have reference signal generating units and signal comparing units. The reference signal generating units receive a reference signal, and generate a plurality of reference signals having equally spaced parameters values with the parameter value of the reference signal being a base point. The signal comparing units receive a to-be-measured signal, compares the to-be-measured signal with a plurality of reference signals output from the reference signal generating units, and output the comparison results. Note that the signal comparing units can output comparison results for the respective reference signals.

In the present invention, for example, the measurement range can be extended by increasing the number of measuring circuits in accordance with a required amount, the resolution can be improved by increasing the number of measuring circuits in accordance with a required amount, and the measurement accuracy can be improved by increasing the number of measuring circuits in accordance with a required amount. Therefore, the performance can be improved without any waste. This makes it possible to implement necessary performance while minimizing the area occupied by measuring circuits. Note that in the present invention, a plurality of measuring circuits can be arranged in a row. Obviously, this includes a case in which a plurality of measuring circuits are arranged in a plurality of rows.

A given measuring circuit can receive a reference signal having the value obtained by adding or subtracting, to or from the parameter value of the reference signal input to another measuring circuit corresponding to the preceding stage of the given measuring circuit, the product of the interval of the parameter values of the reference signals generated by the reference signal generating unit of another measuring circuit and the number of reference signals. In this case, the difference between the parameter values of the reference signals in two adjacent measuring circuits corresponds to the measurement range of one measuring circuit. Therefore, a measurement range corresponding to the number of measuring circuits can be obtained as the measurement range of the signal measuring device.

A given measuring circuit may receive a reference signal having the largest parameter value generated by another measuring circuit corresponding to the preceding stage of the given measuring circuit. In this case, since there is no need to newly provide any means for setting parameter values for reference signals, the arrangement can be simplified.

A given measuring circuit can receive a reference signal having the value obtained by adding or subtracting, to or from the parameter value of the reference signal input to another measuring circuit corresponding to the preceding stage of the given measuring circuit, the quotient obtained by dividing the interval of the parameter values of the reference signals generated by the reference signal generating unit of another measuring circuit by the total number of measuring circuits. In this case, although reference signals are generated in the respective measuring circuits such that the parameter values are equally spaced, the base points of parameter values in the respective measuring circuits are shifted from each other by "the quotient obtained by dividing the interval of parameter values by the number of measuring circuits". Therefore, the resolution is improved by the number of measuring circuits.

In addition, all the measuring circuits can receive reference signals having the same parameter value. In this case, since a plurality of measuring circuits having the same measurement range simultaneously measure one to-be-measured signal, the measurement accuracy can be improved by the number of measuring circuits.

The present invention can further comprise a switching circuit which selects and supplies one of a plurality of reference signals having different parameter values to a measuring circuit. This switching circuit selects one of at least two reference signals of, for example, the following three reference signals. The first reference signal is a signal having the value obtained by adding or subtracting, to or from the parameter value of the reference signal input to another measuring circuit corresponding to the preceding stage of a measuring circuit, the product of the interval of the parameter values of the reference signals generated by the reference signal generating unit of another measuring circuit and the number of reference signals. The second reference signal is a signal having the value obtained by adding or subtracting, to or from the parameter value of the reference signal input to another measuring circuit corresponding to the preceding stage of a measuring circuit, the quotient obtained by dividing the interval of the parameter values of the reference signals generated by the reference signal generating unit of another measuring circuit by the total number of measuring circuits. The third reference signal is a signal having the same parameter value as that supplied to all the measuring circuits. In this case, a desired one of performances concerning a measurement range, resolution, measurement accuracy, and the like can be improved for every measurement.

Examples of the parameters of a reference signal and to-be-measured signal are a voltage and a phase. That is, a voltage or a phase can be set as a measurement target. A phase can be reworded as a time. Obviously, the measurement target to be set in the present invention is not limited to this.

Note that the signal measuring device according to the present invention generally comprises an integrated circuit formed on a semiconductor substrate.

In other words, the first invention is characterized by including a plurality of measuring circuits each having an arrangement which can receive a measurement range lower limit signal for determining a measurement range lower limit $Vm$ and output a measurement range upper limit signal $Vm+S$ ($S$ is a measurement range) for determining the measurement range upper limit of a measurement range, and implementing performance higher than that of each measuring circuit by properly providing the measurement range lower limit $Vm$ of each measuring circuit. Required performance can be implemented, while the area of each measuring circuit is minimized, by using a plurality of small-scale measuring circuits whose performance concerning a noise component (variations, thermal noise, flicker noise, or the like) depending on the measurement range, resolution, or transistor size is lower than required performance, and by properly determining a signal for determining the measurement range lower limit of each small-scale measuring circuit in accordance with measurement performance.

The second invention is characterized by including a circuit which can statically or dynamically switch measurement performances by having an input selection circuit which can select, as a measurement range lower limit signal to be input to each measuring circuit, the same measurement range lower limit signal as that for other measuring circuits, an externally generated measurement range lower limit signal, or a measurement range upper limit signal for another measuring circuit. The ranges or resolutions required for the measurement of a measurement target are dynamically switched after design by using a switching circuit which switches the inputs of one or a plurality of small-scale measuring circuits in accordance with measurement performance.

The present invention can have the following arrangements. The present invention to be described below includes integrated circuits formed on semiconductor substrates.

The first integrated circuit is characterized by comprising a plurality of measuring circuits whose measurement range lower limits can be externally set, and having a function of setting different measurement range lower limits between the measuring circuits, and a function of arranging a plurality of measuring circuits having the same measurement range lower limit.

The second integrated circuit is characterized by making each of n circuits of the above measuring circuits in the first integrated circuit have an arrangement which can receive a measurement range lower limit signal for determining a measurement range lower limit, and including a function of extending the measurement range to $S(N)+Vs(N-1)-Vs(1)$ by setting all values k (1 to N−1) such that a measurement range lower limit signal $Vs(k+1)$ of the (k+1)th measuring circuit becomes equal to or less than $Vs(k)+S(k)$, when the measurement range of the kth (k is an integer from 1 to N−1) measuring circuit is represented by $S(k)$ and the value of the measurement range lower limit is represented by $Vs(k)$.

The third integrated circuit comprises n measuring circuits in the first integrated circuit which have the same measurement range (represented by S) and the same measurement resolution (represented by Td), and can receive measurement range lower limit signals for determining measurement range lower limits. The third integrated circuit has a function of having a measurement range S and improving the measurement resolution to Td/n by setting the measurement range lower limit signal for the kth (k is an integer from 1 to N) measuring circuit to $Vs+(k-1)\times Td/n$ (Vs is the lower limit of the measurement range).

The fourth integrated circuit comprises a plurality of measuring circuits in the first integrated circuit which can receive measurement range lower limit signals for determining measurement range lower limits and output measurement range upper limit signals for determining measurement range upper limits. The fourth integrated circuit includes a function of improving the measurement range to $S(i)+S(i+1)$ by connecting a measurement range upper limit signal for the ith measuring circuit having a measurement range $S(i)$ to a measurement range lower limit signal for the (i+1)th measuring circuit having a measurement range $S(i+1)$.

The fifth integrated circuit is characterized in that each of n circuits of the measuring circuits in one of the first to fourth integrated circuits has the same measurement range and an arrangement which can receive a measurement range lower limit signal for determining a measurement range lower limit, and is characterized by having a function of setting the values of all the measurement range lower limit signals to the same value.

The sixth integrated circuit is the integrated circuit defined in one of claims 1 to 5 which is characterized in that the measuring circuit in one of the first to fifth integrated circuits has a means which can switch signals to be connected to a measurement range lower limit signal in accordance with required performance, and is characterized by including a function of switching measurement ranges, resolutions, or the numbers of measuring circuit of the fifth integrated circuit which are to be operated in parallel.

The seventh integrated circuit is characterized in that the measuring circuit in one of the first to sixth integrated circuits is a voltage measuring circuit comprising a terminal which receives a measurement range lower limit Vm for the voltage measuring circuit, a reference voltage generating unit which can output (n+1) types of voltages (Vm+(k−1)×S/n) (S is the measurement range of the measuring circuit, and k is an integer from 1 to N+1) in increments of S/n (n is an integer), n voltage comparators which compare n types of voltages from Vm to Vm+(n−1)×S/n with a to-be-measured voltage, and a terminal which outputs a measurement range upper limit Vm+S/n for the voltage measuring circuit.

The eighth integrated circuit is characterized in that the measuring circuit in one of the first to sixth integrated circuits is a clock phase difference measuring circuit comprising a terminal which receives a measurement range lower limit Tm of the phase difference measuring circuit, a reference phase generating unit which can output (n+1) types of clocks having different output timings from Tm to Tm+S which are shifted from each other by S/n (n is an integer), n phase comparators which compare n types of phases from Tm to Tm+(n−1)×S/n with the phase of a to-be-measured clock, and a terminal which outputs a measurement range upper limit Tm+S/n of the phase difference measuring circuit.

The ninth integrated circuit is characterized in that the measuring circuit in one of the first to sixth and eighth integrated circuits is a clock phase difference measuring circuit comprising a terminal which receives a measurement range lower limit Tm of the phase difference measuring circuit, a reference phase generating unit which can output (n+1) types of clocks having output timings Tm to Tm+S which are shifted from each other by S/n (n is an integer), a terminal which receives a measurement range lower limit Ts of a to-be-measured clock timing, a to-be-measured phase generating unit which can output (n+1) types of clocks having output timings Ts to Ts+(S+nΔT) which are shifted from each other by S/n+ΔT (n is an integer), n phase comparators which compare the kth (k is an integer from 1 to n) output phase from the reference phase generating unit with the kth output phase from the to-be-measured phase generating unit, and a terminal which outputs a generation range upper limit Tm+S/n of the reference phase generating unit and a generation range upper limit Ts+(S+nΔT) of the to-be-measured phase generating unit.

According to the present invention, using a plurality of measuring circuits in accordance with required measurement performance such as a measurement range or resolution will implement desired performance while minimizing the area of each measuring circuit. In addition, using a switching circuit which switches the inputs of a plurality of measuring circuits in accordance with measurement performance will dynamically switch ranges or resolutions required for the measurement of a measurement target after design.

The invention claimed is:

1. A signal measuring device comprising a plurality of measuring circuits, each measuring circuit comprising:
   a reference signal generating unit which receives an input reference signal and generates a plurality of output reference signals having equally spaced parameter values referenced from a parameter measurement range lower limit of the input reference signal; and
   a signal comparing unit which receives a to be measured signal, compares the to be measured signal with the plurality of output reference signals output from said reference signal generating unit, and outputs comparison results.

2. A signal measuring device according to claim 1, characterized by further comprising a switching circuit which selects and supplies one of a plurality of input reference signals having different parameter values to said each measuring circuit.

3. A signal measuring device according to claim 2, characterized in that said switching circuit selects one of at least two input reference signals of a first input reference signal having a value obtained by adding or subtracting, to or from the parameter value of an input reference signal input to another measuring circuit of said plurality of measuring circuits corresponding to a preceding stage of said measuring circuit, a product of an interval of the parameter values of a plurality of output reference signals generated by a reference signal generating unit of said other measuring circuit and the number of reference signals in the plurality of output reference signals, a second input reference signal having a value obtained by adding or subtracting, to or from the parameter value of the input reference signal input to said other measuring circuit, a quotient obtained by dividing an interval of the parameter values of the plurality of output reference signals generated by the reference signal generating unit of said other measuring circuit by a total number of measuring circuits, and a third input reference signal having a same parameter value as that supplied to all measuring circuits.

4. A signal measuring device according to claim 1, characterized in that said signal comparing unit outputs a comparison result for each of the plurality of output reference signals.

5. A signal measuring device according to claim 1, characterized in that said plurality of measuring circuits are arranged in a row.

6. A signal measuring device according to claim 1, characterized in that said each measuring circuit receives an input reference signal having a value obtained by adding or subtracting, to or from the parameter value of an input reference signal input to another measuring circuit of said plurality of measuring circuits corresponding to a preceding stage of said measuring circuit, a product of an interval of the parameter values of a plurality of output reference signals generated by a reference signal generating unit of said other measuring circuit and the number of reference signals in the plurality of output reference signals.

7. A signal measuring device according to claim 1, characterized in that said each measuring circuit receives an input reference signal having a largest parameter value generated by another measuring circuit of said plurality of measuring circuits corresponding to a preceding stage of said measuring circuit.

8. A signal measuring device according to claim 1, characterized in that said each measuring circuit receives an input reference signal having a value obtained by adding or subtracting, to or from the parameter value of an input reference signal input to another measuring circuit of said plurality of measuring circuits corresponding to a preceding stage of said each measuring circuit, a quotient obtained by dividing an interval of the parameter values of a plurality of output reference signals generated by a reference signal generating unit of said other measuring circuit by a total number of measuring circuits.

9. A signal measuring device according to claim 1, characterized in that each of said plurality of measuring circuits receives an input reference signal having the same parameter value as the parameter value of the input reference signal received by each of all other measuring circuits.

10. A signal measuring device according to claim 1, characterized in that parameters of the input and output reference signals and a to be measured signal are voltages.

11. A signal measuring device according to claim 1, characterized in that parameters of the input and output reference signals and a to be measured signal are phases.

12. A signal measuring device according to claim 1, characterized in that said device comprises an integrated circuit formed on a semiconductor substrate.

* * * * *